United States Patent
Kinsley et al.

(10) Patent No.: US 7,269,042 B2
(45) Date of Patent: *Sep. 11, 2007

(54) MEMORY STACKING SYSTEM AND METHOD

(75) Inventors: Thomas H. Kinsley, Boise, ID (US); Kevin M. Kilbuck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/413,793

(22) Filed: Apr. 28, 2006

(65) Prior Publication Data

US 2006/0198178 A1 Sep. 7, 2006

Related U.S. Application Data

(63) Continuation of application No. 10/932,834, filed on Sep. 1, 2004, now Pat. No. 7,046,538.

(51) Int. Cl.
*G11C 5/00* (2006.01)
*G11C 7/00* (2006.01)

(52) U.S. Cl. .............. 365/52; 365/189.08; 365/225.7; 365/230.03

(58) Field of Classification Search ............ 365/51, 365/52, 63, 189.05, 189.08, 230.03, 230.08
See application file for complete search history.

(56) References Cited

U.S. PATENT DOCUMENTS

| | | | |
|---|---|---|---|
| 4,884,237 A | 11/1989 | Mueller et al. | |
| 5,963,464 A | 10/1999 | Dell et al. | |
| 6,278,616 B1 | 8/2001 | Gelsomini et al. | |
| 6,298,426 B1 | 10/2001 | Ajanovic | |
| 6,404,662 B1 | 6/2002 | Cady et al. | |
| 6,633,948 B1 | 10/2003 | Pelissier et al. | |
| 6,683,372 B1 | 1/2004 | Wong et al. | |
| 6,765,812 B2 | 7/2004 | Anderson | |
| 6,771,526 B2 | 8/2004 | LaBerge | |
| 6,961,281 B2 | 11/2005 | Wong et al. | |

OTHER PUBLICATIONS

PCT International Search Report dated Jan. 30, 2006 (4 pages).

*Primary Examiner*—Trong Phan
(74) *Attorney, Agent, or Firm*—TraskBritt, PC

(57) ABSTRACT

A method of forming a stacked memory module from a plurality of memory devices is provided. Each of the plurality of memory devices is modified to include a logic block for decoding a plurality of chip select signals. A first high density memory module is also provided that includes the modified memory devices and a serial presence detect device. The first high density memory module is included within an electronic system. Also, an additional method of forming a stacked memory module is provided, the method requiring modification of an address buffer to include a logic block for decoding a plurality of chip select signals. A second high density memory module is also provided that includes the modified address buffer and a serial presence detect device. The second high density memory module is included within an electronic system.

16 Claims, 5 Drawing Sheets

MEMORY STACKING SYSTEM AND METHOD

CROSS-REFERENCE TO RELATED APPLICATION

This application is a continuation of U.S. patent application Ser. No. 10/932,834, filed Sep. 1, 2004, now U.S Pat. No. 7,046,538, issued May 16, 2006.

BACKGROUND OF THE INVENTION

1. Field of the Invention

The present invention relates to the field of semiconductor memories and, more particularly, to the formation of high density memory modules.

2. State of the Art

In recent history, computer memory storage devices have quadrupled in memory capacity about every three years. In order to remain competitive, semiconductor industry leaders continually strive to shrink circuit feature sizes and design more efficient memory hierarchies. Developmental costs for new chip design and fabrication processes are high, and require an equally expensive investment in new manufacturing equipment. On the other hand, consumers and other industries are striving for alternative low-cost and instantaneous solutions. One such solution is "memory stacking."

Identical memory devices have corresponding address, power supply, and data lines that may be paralleled. As a result, like memory devices may be physically stacked upon one another with the bottom device mounted on a printed circuit board or other second level package. Stacked devices are denoted by rank, with the bottom device designated as a "rank one" device. The top device of a two-deep stacking arrangement is designated as a "rank two" device. Multiple ranks may exist with each rank relating to the number of devices stacked underneath the ranked device. Multiple devices may exist for each rank as well.

The pins of each device or rank are connected to each other via simple soldering or often via a special connective casing. Pins receiving signals that cannot be paralleled are not connected together, and must instead have separate pin locations. Generally, the "chip select" ("CS") pin, which, when active, selects the memory device rank for reading and writing operations, is not paralleled with other device CS pins. Because not all memory devices in a memory stack need to be activated at the same time, the CS pins have traditionally not shared signals with other CS pins.

One method of achieving separate control of each device in a stacked memory module is to extend a separate CS trace from the memory controller to each of the stacked devices. For example, FIG. 1 depicts a stacked memory module 1 comprising two stacked conventional memory devices or ranks 12. A memory controller 10 may activate each of the memory devices or ranks 12 by passing an appropriate signal along a trace carrying a first chip select signal 14 or a second chip select signal 16. Thus, in general, a stacked memory module with "n" stacked devices has "n" CS traces connecting it to the memory controller, where "n" is an integer. Although simple in concept, the limitations are apparent. Greater numbers of stacked devices will require greater numbers of CS traces. Because circuit board space is limited, this solution quickly becomes impracticable as the number of stacked devices increases.

One solution, disclosed in U.S. Pat. No. 4,884,237 which retains the original single memory device footprint, is the utilization of "no-connection" pins ("NC"). In the disclosed method, dynamic random access memory ("DRAM") device NC pins were conductively connected to the device CS pin. Thus, wherein the lower DRAM device may receive a CS signal sent directly to the device's CS pin, the upper device may instead receive a CS signal through one of its NC pins that has been shorted to the device's CS pin. The effect is the same as in the first method: both devices receive a traditional CS signal. Similarly, the number of CS signal lines extending from the memory controller must equal the number of stacked devices. However, the advantage of the second method is that no additional pin locations are necessary, hence preserving the original memory device footprint.

As memory devices have grown more complex, however, and as the demand to stack greater numbers of memory devices has increased, the above-described methods have proven inadequate. Circuit board space is even more limited, and memory devices have only limited NC pins that may be shorted to CS pins. Memory devices, such as DRAM devices, are typically mounted on standardized dual inline memory modules ("DIMMs") that have a set, standardized pin and trace layout. Each DIMM typically includes, for example, 18 DRAM devices, address, data, and power traces, one CS trace and one NC trace. Clearly, the one CS trace can act to select the 18 DRAM devices on the DIMM, and the NC trace may be used to send a CS signal to a second rank of 18 stacked DRAM devices (assuming the NC pins have been shorted to the CS pins on the second rank of DRAM devices), but further control of higher stacked DRAM devices is not available through the disclosed methods.

Accordingly, there is a clear need in the art for improved memory stacking and methods, particularly in the chip selection of higher density memory modules.

BRIEF SUMMARY OF THE INVENTION

In one embodiment of the present invention, a method of forming a stacked memory module from a plurality of memory devices is provided. The plurality of memory devices is modified to include a logic block for decoding a plurality of chip select signals. The plurality of memory devices is also stacked to interconnect a plurality of pins. A serial presence detect device is also updated to indicate that the stacked memory module includes the plurality of memory devices and that each of the plurality of chip select signals is transmitted to a corresponding one of a plurality of designated pins on the plurality of memory devices.

In a further embodiment of the present invention, a high density memory module is provided. The high density memory module includes a plurality of memory devices, each memory device further including logic circuitry to decode a binary combination of a plurality of chip select signals. The high density memory module also includes a serial presence detect device capable of indicating to a memory controller a number of chip select signals to be sent to the plurality of memory devices, a manner of encoding the chip select signals, and a designation of traces on which the chip select signals are to be sent.

In yet a further embodiment of the present invention, an electronic system is provided. The electronic system includes an input device, an output device, a memory system and a processor device coupled to the input device, the output device and the memory system. The memory system further includes a memory controller. At least one of the input device, the output device, the processor and the memory system includes a high density memory module. The high density memory module includes a plurality of memory devices, each memory device further including logic means to decode a binary combination of a plurality of chip select signals. The high density memory module also includes a serial presence detect device capable of indicating to a memory controller a number of chip select signals to be sent to the plurality of memory devices, a manner of encoding the chip select signals, and a designation of traces on which the chip select signals are to be sent.

In another embodiment of the present invention, a method of forming a stacked memory module from a plurality of memory devices is provided. An address buffer is modified to include a logic block for decoding a plurality of chip select signals. The address buffer is also connected to a plurality of memory devices. A chip select pin of each of the plurality of memory devices is connected to the address buffer. The plurality of memory devices is stacked. A serial presence detect device is updated to indicate that the stacked memory module includes the plurality of memory devices and that each of the plurality of chip select signals is transmitted to the address buffer.

In a further embodiment of the present invention, a high density memory module is provided. The high density memory module includes a plurality of memory devices, an address buffer and a serial presence detect device. The plurality of memory devices each includes a chip select pin. The address buffer includes a logic block to decode a binary combination of chip select signals. The serial presence detect device is capable of indicating to a memory controller a number of chip select signals to be sent to the plurality of memory devices, a manner of encoding the chip select signals, and a designation of traces on which the chip select signals are to be sent.

In another embodiment of the present invention, an electronic system is provided. The electronic system includes an input device, an output device, a memory system and a processor device coupled to the input device, the output device and the memory system. The memory system further includes a memory controller. At least one of the input device, the output device, the processor and the memory system includes a high density memory module. The high density memory module includes a plurality of memory devices, an address buffer and a serial presence detect device. The plurality of memory devices each includes a chip select pin. The address buffer includes a logic block to decode a binary combination of chip select signals. The serial presence detect device is capable of indicating to a memory controller a number of chip select signals to be sent to the plurality of memory devices, a manner of encoding the chip select signals, and a designation of traces on which the chip select signals are to be sent.

BRIEF DESCRIPTION OF THE SEVERAL VIEWS OF THE DRAWINGS

Embodiments of the present invention will now be described, by way of example only, with reference to the following drawings in which.

DETAILED DESCRIPTION OF THE INVENTION

The present invention is described by reference to the associated drawing figures. Identical labels and numbers in multiple drawing figures are meant to represent the same elements in each drawing figure. Certain terms are used throughout and have meanings identified below, unless otherwise specified.

The term "high density memory module" refers to a packaged memory device that incorporates a large storage capability and exhibits a physically small circuit footprint. A high density memory module may be created by stacking individual memory devices.

The term "stacked memory module" refers to two or more like memory devices with address, data, and power pins wired in parallel, but with a characteristic that one memory device may be selected for read/write operations while the other memory devices are not selected. To achieve a stacked memory module, some memory devices are physically stacked on top of each other with like pins connecting. In a stacked configuration the bottom memory device is termed a rank one device; the second stacked memory device is termed a rank two device, etc.

The term "serial presence detect device" refers to a device on a memory module that contains information available to a memory controller concerning the characteristics and requirements of the memory module. For example, a serial presence detect device may indicate to a memory controller that a particular memory module has two ranks and requires two chip select signals.

The term "fuse blow" refers to a process of programming logic into a programmable semiconductor device.

Figure 2:
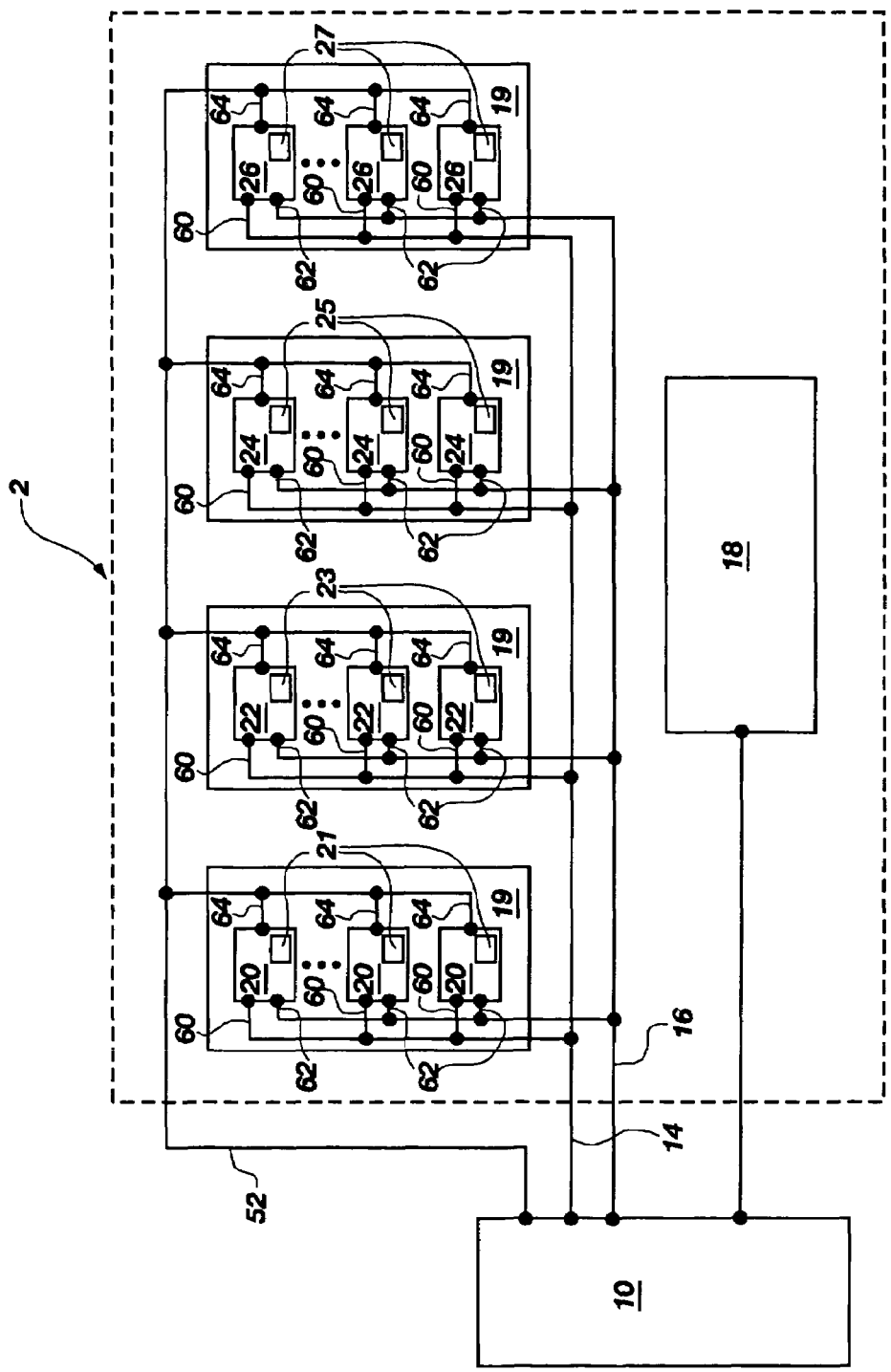
FIG. 2 is a simplified block diagram of a four-stacked memory module, in accordance with an embodiment of the present invention.

FIG. 2 is a simplified block diagram of a four-stacked memory module 2, in accordance with an embodiment of the present invention. The stacked memory devices are described as a first or rank one memory device 20, a second or rank two memory device 22, a third or rank three memory device 24 and a fourth or rank four memory device 26. Multiple rank one memory devices 20 are depicted, each mounted on a single memory device mounting board 19. Similarly, multiple rank two, rank three and rank four memory devices 22, 24 and 26 are each mounted on a corresponding memory device mounting board 19. Each of the memory devices 20, 22, 24 and 26 also include a chip select pin 60 and at least one no-connect pin 62. In FIG. 2, the chip select pins 60 have each been connected with a first chip select signal 14, originating from a memory controller 10. The no-connect pins 62 of each of the memory devices 20, 22, 24, and 26 connect to a second chip select signal 16. Also in FIG. 2, the memory devices 20, 22, 24 and 26 are each mounted on a memory device mounting board 19 corresponding to the rank of the respective memory devices 20, 22, 24 and 26.

The four-stacked memory module 2 of the exemplified first embodiment of the present invention is produced by first modifying the logic of four conventional memory devices. The first memory device 20 is modified by fuse blowing an additional block of logic 21 into the memory device 20, allowing the memory device 20 to be activated, for example, when both the first chip select signal 14 and the second chip select signal 16 are active low. In other words, if the chip select pin 60 and the utilized no-connect pin 62 of memory device 20 are driven active low by the two chip select signals 14 and 16, then the memory device 20 is selected and activated.

Similarly, memory device 22 is modified by fuse blowing a logic block 23 that activates the memory device 22 upon occurrence, for example, of an active low first chip select signal 14 and a high second chip select signal 16. Memory device 24 also includes, for example, a fuse blown logic block 25 that activates the memory device 24 upon occurrence of a high first chip select signal 14 and an active low second chip select signal 16.

Finally, and again by way of example and not limitation, memory device 26 includes an additional fuse blown logic block 27 that activates the memory device 26 upon occurrence of both first and second chip select signals 14 and 16 being high. Thus, through any one of, for example, four state combinations of first and second chip select signals 14 and 16, one of the four memory devices 20, 22, 24 and 26 may be selected. The selection process is the result of a more general decoding process. The decoding is implemented by either fuse blowing logic in the form of a single-stage decoder consisting of inverters and NAND gates, or by applying a look-up table.

After modification of the four memory devices 20, 22, 24 and 26, the memory devices 20, 22, 24 and 26 are connected together or stacked via traces connecting like pins of the memory devices 20, 22, 24 and 26, in accordance with the first embodiment of the present invention. Like address pins, power supply pins and data pins are connected together. Specifically, as shown in FIG. 2, the chip select pins 60 and the no-connect pins 62 will also be connected together. This process is often implemented by using DRAM devices that have been mounted on DIMMs. Traces on the DIMMs are configured to connect like pins of the DRAM devices mounted on the DIMMs. Further connections, then, may be made by simply connecting like pins of multiple DIMMs. Each DIMM which is populated with like devices makes up a four-rank DIMM. Adding more or less stacked devices determines the data bus width of the DIMM memory module 2. For example, using four DIMM memory modules 2 results in a 16-rank system. Under this embodiment, FIG. 2 demonstrates the connectivities of four individual DRAM devices from four separate but connected DIMMs.

Finally, a serial presence detect device 18 specific to the memory module 2 is updated to indicate to the memory controller 10 that the memory module 2 has four stacked memory devices 20, 22, 24 and 26 and that the memory devices 20, 22, 24 and 26 require two chip select signals 14 and 16 properly encoded to select any one of the four memory devices 20, 22, 24 and 26. In one embodiment, the serial presence detect device 18 is an electrically erasable programmable read-only memory ("EEPROM") located on one of the DIMMs, and it may act to create or update a look-up table corresponding to a specifically configured memory module used by the memory controller 10.

A potential limitation of the heretofore disclosed embodiment of the present invention is that one of the four memory devices 20, 22, 24 and 26 is always selected. When one memory device is de-selected, another must, by necessity, be selected. Although other activating signals may exist to safeguard against unwanted memory read/write actions, an option exists in the first embodiment to enable or disable chip select signal interpretation. The option is applied by utilization of an unused address pin 64. As long as the memory devices 20, 22, 24 and 26 each have an unused address pin 64, the additional logic can be modified to only activate a specific memory device 20, 22, 24 and 26 when both the existing logic conditions concerning the chip select signals 14 and 16 are met and a third chip select signal 52 entering through the unused address pin 64 is, for example, active low. Thus, according to the exemplified logic, memory device 20 is only active and selected when all three signals, the first chip select signal 14, the second chip select signal 16 and the third chip select signal 52, are active low. Memory device 26 is only active and selected when the first and second chip select signals 14 and 16 are high and the third chip select signal 52 is active low. A high third chip select signal 52 would effectively mask any chip select signals 14 and 16 activating any of the memory devices 20, 22, 24 and 26. This modified logic is implemented through either a fuse blown two-stage decoder or a look-up table. The serial presence detect device 18 is also modified to thereby indicate to the memory controller 10 that a third chip select signal 52 must be transmitted along the unused address trace, which, for example, may be a high order unused address pin such as trace A15 when using DIMMs mounted with 2 gigabyte DRAM devices.

Figure 1:
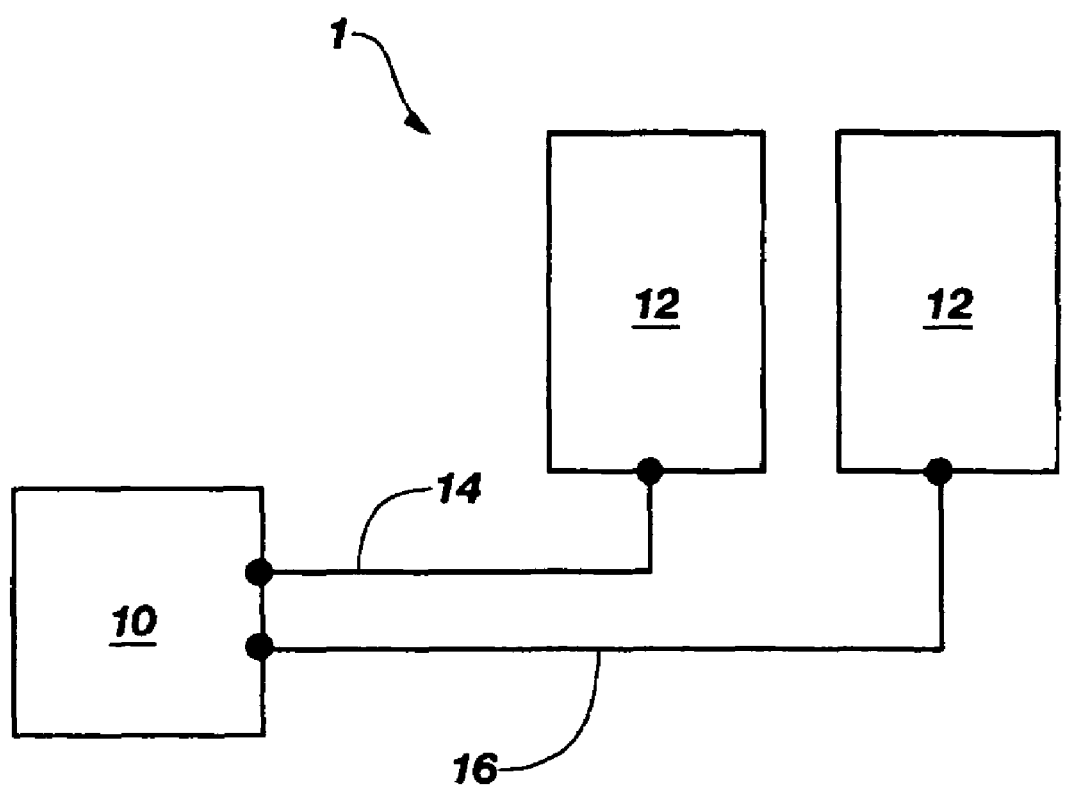
FIG. 1 is a block diagram depicting a prior art memory stacking solution.
Figure 3:
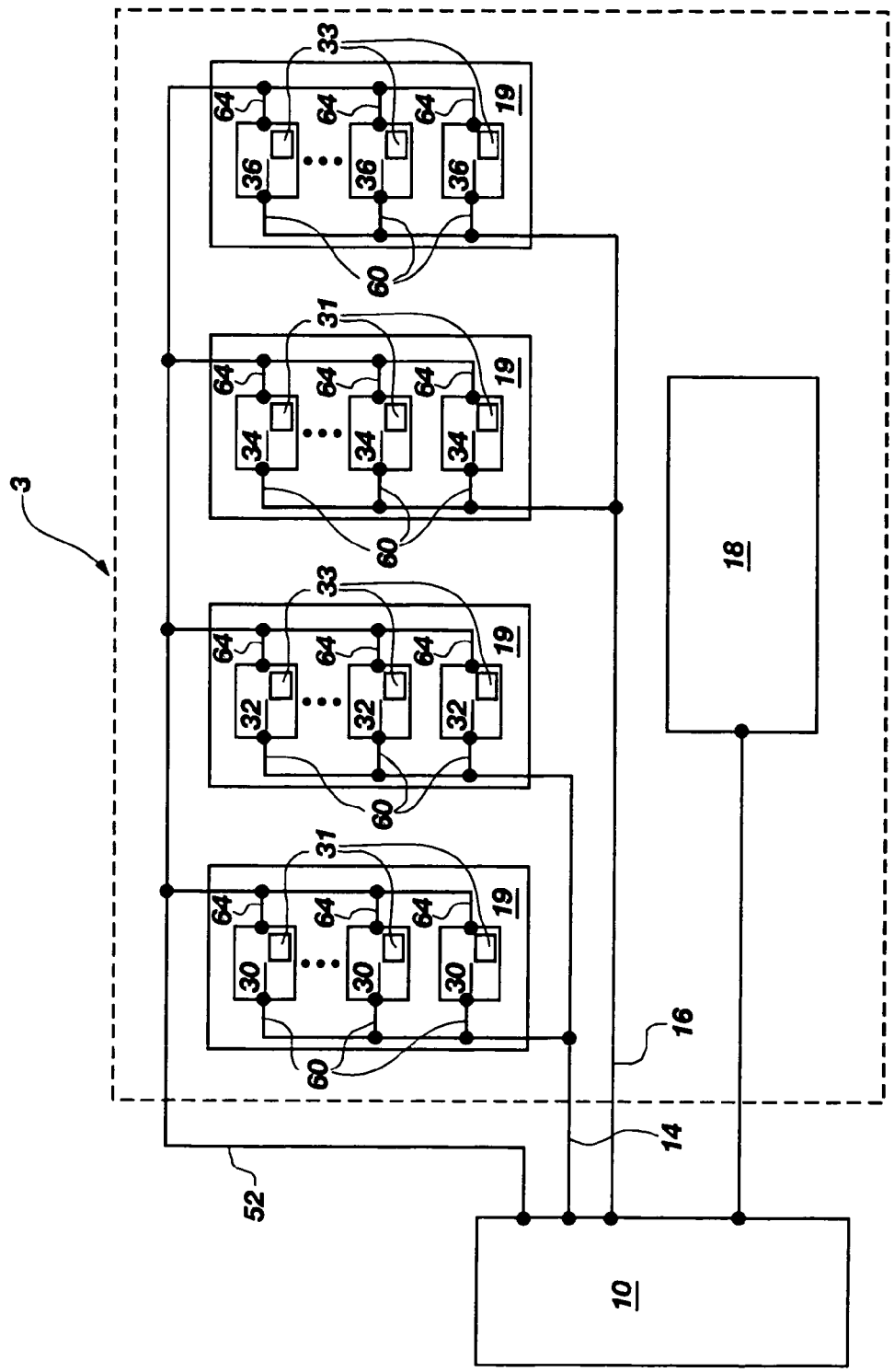
FIG. 3 is a simplified block diagram of a four-stacked memory module, in accordance with another embodiment of the present invention.

FIG. 3 is a simplified block diagram of a four-stacked memory module 3 demonstrating a second exemplary embodiment of the present invention. The second embodiment requires three chip select signals but only two different fuse blowing processes, compared with the four required by the first embodiment. The four-stacked memory module 3 includes four stacked memory devices 30, 32, 34 and 36. The first and the third memory devices 30 and 34 are identical, while the second and the fourth memory devices 32 and 36 are also identical to each other. All four memory devices 30, 32, 34 and 36 are modified to be distinguished from a standard memory device 12 (FIG. 1).

Each of the four memory devices 30, 32, 34 and 36 are mounted on separate memory device mounting boards 19, and multiple memory devices 30, 32, 34 and 36 may be mounted on the corresponding memory device mounting boards 19. The memory devices 30, 32, 34 and 36 each have a chip select pin 60 and an unused address pin 64. The chip select pins 60 of memory devices 30 and 32 are connected to a first chip select signal 14, received from a memory controller 10, while the chip select pins 60 of memory devices 34 and 36 are connected to a second chip select signal 16, also received from the memory controller 10. Each of the memory devices 30, 32, 34 and 36 are connected to a third chip select signal 52 via the unused address pin 64 as previously described.

The four-stack memory module 3 of another exemplary embodiment of the present invention is produced by fuse blowing additional logic into the memory devices 30, 32, 34 and 36. Specifically, memory devices 30 and 34 are given additional logic block 31 enabling the memory devices 30 and 34 to be selected upon the occurrence, for example, of both chip select pin 60 and unused address pin 64 being active low. Similarly, memory devices 32 and 36 may be given additional logic block 33 enabling the memory devices 32 and 36 to be selected upon the occurrence, for example, of both chip select pin 60 being active low and unused address pin 64 being high. The result is that third chip select signal 52 effectively selects either ranks one and three, symbolized by memory devices 30 and 34, or ranks two and four, symbolized by memory devices 32 and 36. The first chip select signal 14 acts as an enable signal for memory devices 30 and 32, while the second chip select signal 16 acts as an enable signal for only memory devices 34 and 36.

Together, the three chip select signals 14, 16 and 52 function to effectively select either one or none of the four memory devices 30, 32, 34 and 36, while requiring that only two sets of logic blocks be added to the memory devices 30, 32, 34 and 36—one set for ranks one and three, and one set for ranks two and four. Once again, the decoding process may be implemented by either fuse blowing logic in the form of a single-stage decoder consisting of inverters and NAND gates, or by applying a look-up table.

After modification of the four memory devices 30, 32, 34 and 36, the memory devices 30, 32, 34 and 36 may be connected together or stacked to create an exemplary embodiment of the four-stacked memory module 3. Like address pins, power supply pins and data pins may be connected together. However, although the chip select pins 60 of memory devices 30 and 32 may be interconnected, the chip select pins 60 of memory devices 30 and 32 are not attached to the similarly interconnected chip select pins 60 of memory devices 34 and 36. Instead, the chip select pins 60 of memory devices 30 and 32 are connected exclusively to first chip select signal 14, while the chip select pins 60 of memory devices 34 and 36 are connected exclusively to second chip select signal 16. The unused address pins 64 of each memory device 30, 32, 34 and 36 are each interconnected by a third chip select signal 52. Once again, this exemplary embodiment may be implemented by interconnecting a set of four DRAM-mounted DIMMs.

Continuing with the exemplary embodiment of the present invention as depicted in FIG. 3, a serial presence detect device 18 specific to the memory module 3 is updated to indicate to the memory controller 10 that the memory module 3 has four stacked memory devices 30, 32, 34 and 36 and that the memory devices 30, 32, 34 and 36 require three chip select signals 14, 16 and 52, properly encoded to select any one of the four memory devices 30, 32, 34 and 36. The chip select signals 14, 16 and 52 must be transmitted to the chip select pins 60 and unused address pins 64 of the memory devices 30, 32, 34 and 36. The serial presence detect device 18 may be an EEPROM located on one of the DIMMs, and acts to create or update a look-up table used by the memory controller 10.

Figure 4:
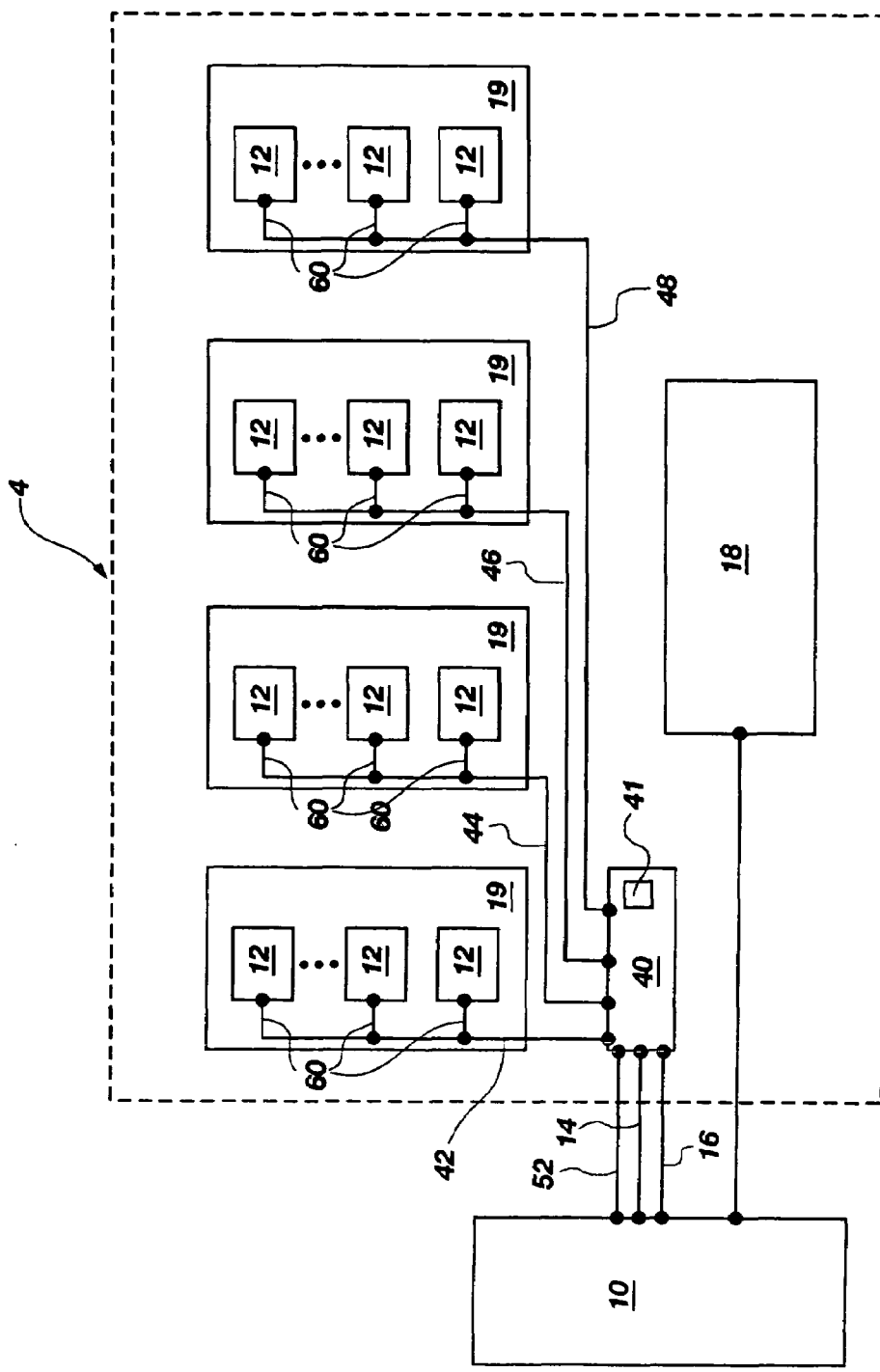
FIG. 4 is a simplified block diagram of a four-stacked memory module, in accordance with a further embodiment of the present invention.

FIG. 4 is a simplified block diagram of a four-stacked memory module 4 in yet another exemplary embodiment of the present invention. Each of the four memory devices 12 in stacked memory module 4 is a standard, unmodified memory device 12 such as a DRAM device. Each memory device 12 is mounted on a memory device mounting board 19 and also includes a single chip select pin 60 connected to an individual and exclusive chip select trace. Chip select traces 42, 44, 46 and 48 each connect a single rank of memory devices to a modified register or address buffer 40. Registers or address buffers are common on stacked memory modules, and are used to boost the signal-strength for adequate communication with each memory device. However, in this exemplary embodiment of the present invention, signals originating from the memory controller 10 pass through the modified address buffer 40 and are interpreted by additional logic 41 found within the modified address buffer 40. Specifically, chip select signals 14, 16 and, optionally 52, carry encoded data to the modified address buffer 40 where the data may be decoded and applied. The modified address buffer 40 then outputs a simple, unencoded chip select signal to any one of the memory devices 12 along one of the four chip select traces 42, 44, 46 and 48. The additional logic 41 in the modified address buffer 40 will result in either a single active chip select output or no active chip select outputs. Therefore, only one memory device rank may be active at any given time, and no additional logic is required in the memory devices.

The modified address buffer 40 may be fuse blown in order to create additional logic 41 within the modified address buffer 40. The logic replaces the logic fuse blown into the memory devices in the first and second exemplary embodiments of the present invention. The modified address buffer 40 could be programmed, as was the logic in the first embodiment, to decode the set of four 2-bit binary combinations created by the chip select signals 14 and 16, and then output a single chip select signal onto the appropriate chip select trace 42, 44, 46 or 48. Additionally, in order to implement a chip enablement option, or to accommodate even more ranks of memory devices, a third chip select signal, utilizing the unused third chip select signal 52, may be inputted to the modified address buffer 40 to force a decode of a 3-bit binary combination, thus creating eight output options. A two-stage decoder consisting of inverters and NAND gates would suffice as the additional logic 41 on the modified address buffer 40; likewise, a look-up table would also suffice.

Once again, in this exemplary embodiment of the present invention, the four ranks of memory devices are stacked together, connecting like address, power supply and data pins. Chip select pins 60, however, must remain separate from each other and must only connect to the memory devices 12 and the modified address buffer 40.

Finally, the serial presence detect device 18 contains means to indicate to the memory controller 10 how many ranks exist on the stacked memory module 4 and how many chip select signals are required, which traces must be used, and how to properly encode the signals in preparation for decoding by the modified address buffer 40. The serial presence detect device 18 may be an EEPROM located on one of the DIMMs, and it may act to create or update a look-up table used by the memory controller 10.

Figure 5:
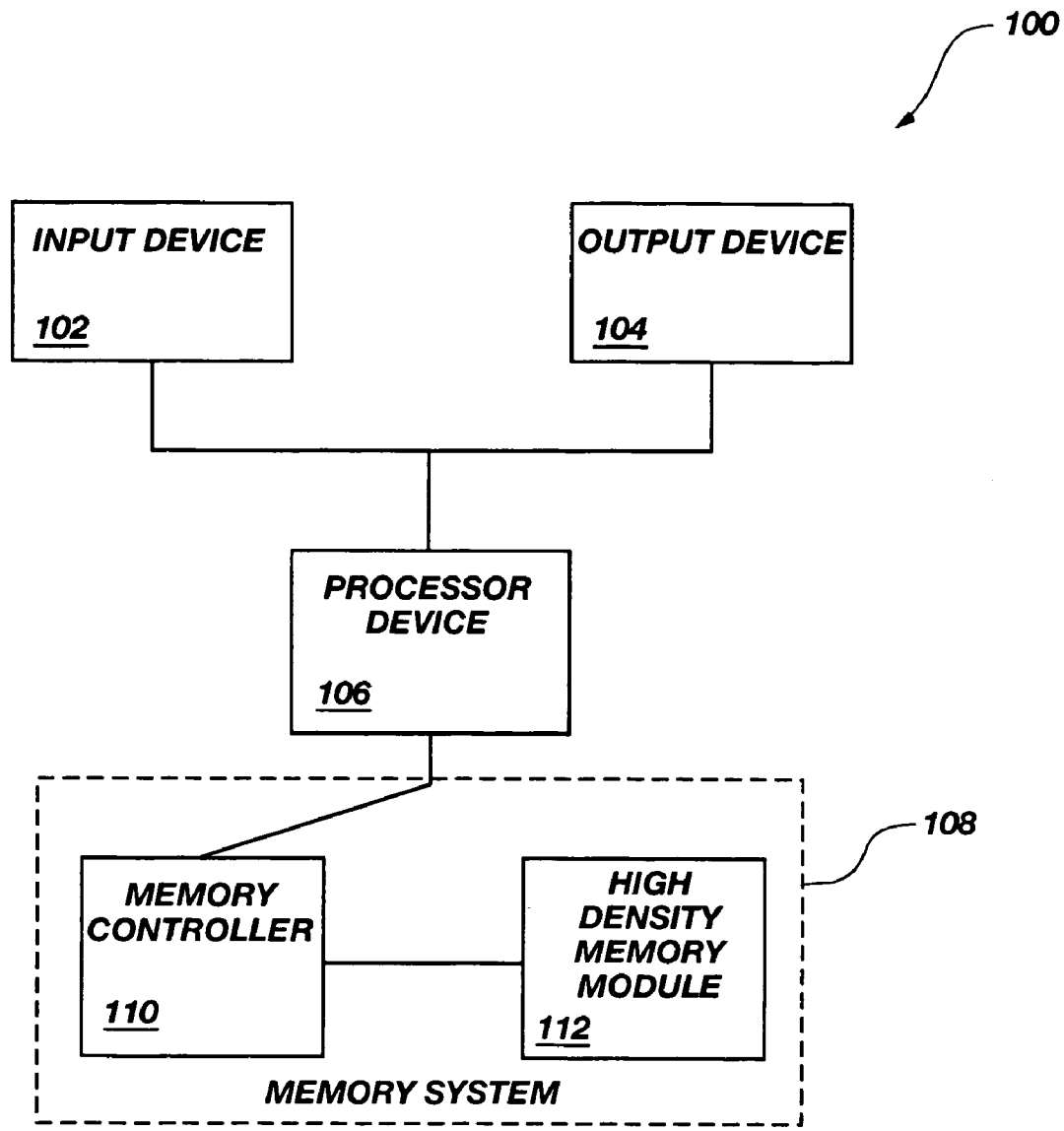
FIG. 5 is a block diagram of an electronic system including a four-stacked memory device, in accordance with an embodiment of the present invention.

FIG. 5 is a block diagram of an electronic system 100 incorporating a high density memory module 112, in accordance with an embodiment of the present invention. The high density memory module 112 may be any one of the embodiments described herein. An electronic system 100 is depicted, which includes an input device 102, an output device 104, a processor device 106 and a memory system 108 incorporating a memory controller 110 and the high density memory module 112. Of course, it will be understood that the high density memory module 112 may be incorporated into any one of the input, output, and processor devices 102, 104 and 106.

The foregoing detailed description of the present invention is provided for purposes of illustration and is not intended to be exhaustive or to limit the invention to the precise embodiment disclosed. Accordingly, the scope of the present invention is defined by the following claims.

What is claimed is:

1. A memory module, comprising:
   a plurality of memory devices each including logic responsive to select in response to a specific activation of a plurality of chip select signals received on at least one chip select pin and at least one unused pin; and
   a serial presence detect device configured to indicate to a memory controller a quantity of the plurality of chip select signals for encoding into a memory address.

2. The memory module of claim 1, wherein the logic is reconfigured to select in response to a blown fuse.

3. The memory module of claim 1, wherein the logic is responsive to select in response to entries in a look-up table.

4. The memory module of claim 1, wherein the at least one unused pin is a no-connect pin or an unused address pin.

5. The memory module of claim 1, wherein the serial presence detect device is further configured in response to the logic to indicate a quantity of stacked memory devices for selection by the plurality of chip select signals.

6. The memory module of claim 1, wherein the serial presence detect device is configured as a read-only memory including a look-up table corresponding to a specifically configured memory module known by the memory controller.

7. A method of forming a stacked memory module, comprising:
configuring in a logic block a plurality of memory devices to be uniquely responsive to activation in a particular stack of memory devices;
interconnecting a plurality of pins between the plurality of memory devices, including a chip select pin and a first unused pin of each of the plurality of memory devices; and
updating a serial presence detect device to indicate the stacked memory module includes the plurality of memory devices and each of a plurality of chip select signals is transmitted to a corresponding one of a plurality of designated pins on the plurality of memory devices.

8. The method of claim 7, further comprising one of a fuse blowing the logic block in the plurality of memory devices and externally configuring the logic block.

9. The method of claim 7, further comprising configuring a look-up table to interpret each of the plurality of chip select signals of the plurality of memory devices.

10. The method of claim 7, wherein providing includes designating selected pins to receive the plurality of chip select signals, the designated pins comprising the chip select pin to which a first one of the plurality of chip select signals is coupled and the first unused pin to which a second one of the plurality of chip select signals is coupled.

11. The method of claim 10, further comprising designating the first unused pin, the first unused pin comprising a no-connect pin or an unused address pin.

12. The method of claim 7, wherein providing includes programming the logic block to result in activation of one of the plurality of memory devices if the plurality of chip select signals forms a unique binary combination that corresponds to the logic block of one of the plurality of memory devices.

13. The method of claim 7, wherein updating includes creating a look-up table to define combinations of the plurality of chip select signals used by a memory controller to communicate with the plurality of memory devices.

14. The method of claim 7, wherein stacking of the plurality of memory devices includes interconnecting a plurality of dual inline memory modules ("DIMMs"), each DIMM comprising a plurality of dynamic random access memory devices.

15. The method of claim 7, wherein stacking of the plurality of memory devices includes interconnecting a second unused pin of each of the plurality of memory devices.

16. The method of claim 15, wherein providing includes designating pins to receive the plurality of chip select signals, the pins comprising the chip select pin to which a first one of the plurality of chip select signals is coupled, the first unused pin to which a second one of the plurality of chip select signals is coupled, and the second unused pin to which a third one of the plurality of chip select signals is coupled.

* * * * *